US00RE43412E

(19) United States
(12) Reissued Patent
Slater, Jr.

(10) Patent Number: US RE43,412 E
(45) Date of Reissued Patent: May 29, 2012

(54) LED WITH SELF ALIGNED BOND PAD

(75) Inventor: David Beardsley Slater, Jr., Baskerville, VA (US)

(73) Assignee: Cree, Inc., Durham, NC (US)

(21) Appl. No.: 12/899,228

(22) Filed: Oct. 6, 2010

Related U.S. Patent Documents

Reissue of:
(64) Patent No.: 7,432,536
Issued: Oct. 7, 2008
Appl. No.: 10/996,666
Filed: Nov. 24, 2004

U.S. Applications:
(60) Provisional application No. 60/625,339, filed on Nov. 4, 2004.

(51) Int. Cl.
*H01L 33/00* (2010.01)

(52) U.S. Cl. ..... 257/99; 257/233; 257/784; 257/E23.02

(58) Field of Classification Search ..... 257/79, 257/94, 99, 233, 292, 656, 784, 786, E23.02
See application file for complete search history.

(56) References Cited

U.S. PATENT DOCUMENTS

| | | | |
|---|---|---|---|
| 4,966,862 | A | 10/1990 | Edmond |
| 5,670,798 | A | 9/1997 | Schetzina |
| 6,459,098 | B1 | 10/2002 | Chen et al. |
| 6,459,100 | B1 | 10/2002 | Doverspike et al. |
| 6,580,096 | B2 | 6/2003 | Chen et al. |
| 6,610,551 | B1 | 8/2003 | Doverspike et al. |
| 6,635,503 | B2 | 10/2003 | Andrews et al. |
| 6,740,906 | B2 | 5/2004 | Slater, Jr. et al. |
| 6,747,298 | B2 | 6/2004 | Slater, Jr. et al. |
| 6,791,119 | B2 | 9/2004 | Slater, Jr. et al. |
| 6,825,501 | B2 | 11/2004 | Edmond et al. |
| 6,853,010 | B2 | 2/2005 | Slater, Jr. et al. |
| 2002/0121642 | A1 | 9/2002 | Doverspike et al. |
| 2002/0123164 | A1 | 9/2002 | Slater, Jr. et al. |
| 2002/0154496 | A1 | 10/2002 | Chen et al. |
| 2003/0015721 | A1 | 1/2003 | Slater, Jr. et al. |
| 2003/0025121 | A1 | 2/2003 | Edmond et al. |
| 2003/0042507 | A1 | 3/2003 | Slater, Jr. et al. |
| 2003/0143767 | A1 | 7/2003 | Andrews et al. |
| 2003/0201453 | A2 | 10/2003 | Edmond |
| 2004/0026707 | A1 | 2/2004 | Slater, Jr. et al. |
| 2004/0056260 | A1 | 3/2004 | Slater, Jr. et al. |
| 2004/0149993 | A1 | 8/2004 | McClure et al. |
| 2004/0200882 | A1 | 10/2004 | Slater, Jr. et al. |
| 2004/0217362 | A1 | 11/2004 | Slater, Jr. et al. |
| 2004/0232433 | A1 | 11/2004 | Doverspike et al. |
| 2005/0019971 | A1 | 1/2005 | Slater, Jr. et al. |

*Primary Examiner* — Thanhha Pham
(74) *Attorney, Agent, or Firm* — Steven B. Phillips; Moore & Van Allen PLLC

(57) ABSTRACT

A method is disclosed for attaching a bonding pad to the ohmic contact of a diode while reducing the complexity of the photolithography steps. The method includes the steps of forming a blanket passivation layer over the epitaxial layers and ohmic contacts of a diode, depositing a photoresist layer over the blanket passivation layer, opening a via through the photoresist above the ohmic contacts and on the blanket passivation layer, removing the portion of the blanket passivation layer defined by the via to expose the surface of the ohmic contact, depositing a metal layer on the remaining photoresist, and on the exposed portion of the ohmic contact defined by the via, and removing the remaining photoresist to thereby concurrently remove any metal on the photoresist and to thereby establish a metal bond pad on the ohmic contact in the via.

17 Claims, 4 Drawing Sheets

Prior Art

LED WITH SELF ALIGNED BOND PAD

Matter enclosed in heavy brackets [ ] appears in the original patent but forms no part of this reissue specification; matter printed in italics indicates the additions made by reissue.

This application claims priority from U.S. Provisional application No. 60/625,339 filed Nov. 4, 2004.

BACKGROUND

The present invention relates to semiconductor devices, and more particularly to light emitting diodes having a bond pad on an ohmic contact.

Light emitting diodes (or LEDs) are well known solid state electronic devices capable of generating light upon application of a sufficient voltage. Light emitting diodes generally comprise a p-n junction formed in an epitaxial layer deposited on a substrate such as sapphire, silicon, silicon carbide, gallium arsenide and the like. The wavelength distribution of the light generated by the LED depends on the material from which the p-n junction is fabricated and the structure of the thin epitaxial layers that comprise the active region of the device.

Commonly, an LED includes an n-type substrate, an n-type epitaxial region formed on the substrate and a p-type epitaxial region formed on the n-type epitaxial region. In order to facilitate the application of a voltage to the device, an anode ohmic contact is formed on a p-type region of the device (typically, an exposed p-type epitaxial layer) and a cathode ohmic contact must be formed on an n-type region of the device (such as the substrate or an exposed n-type epitaxial layer).

In order to bond a wire to an ohmic contact for connecting the device to an external circuit, it is known to form a bond pad on the ohmic contact metal stack. It is also known to protect the LED by depositing a layer of passivation over the entire exposed surface of the device. However, the passivation layer must be partially removed to permit the connection of a wire to the bond pad. Forming and patterning a bond pad and passivation layer may require multiple complicated and expensive photolithography steps which require precise mask alignment. Such steps are time-consuming and errors made during photolithography steps may reduce or harm the operating characteristics of the device, which may result in diminished yields or increased testing costs. Accordingly, it would be desirable to simplify the process of forming bond pads on LED ohmic contacts.

SUMMARY

A light emitting diode includes a substrate, an epitaxial region formed on the substrate, and an ohmic contact formed on an exposed epitaxial layer. A passivation layer covers exposed portions of the substrate, epitaxial layers and ohmic contact. A self-aligned bond pad adapted to receive a wire bond is formed within an opening in the passivation layer.

Method embodiments of the invention include forming an epitaxial region on a substrate, forming an ohmic contact on an exposed epitaxial layer, and depositing a passivation layer over the entire device including the substrate, the epitaxial layers and the ohmic contact. Portions of the passivation layer above the ohmic contact are selectively removed to expose a portion of the surface of the ohmic contact within a via through the passivation layer. A self-aligned bond pad is formed within the via.

The foregoing and other objects and advantages of the invention and the manner in which the same are accomplished will become clearer based on the followed detailed description taken in conjunction with the accompanying drawings.

DETAILED DESCRIPTION

The present invention now will be described more fully hereinafter with reference to the accompanying drawings, in which embodiments of the invention are shown. This invention should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, while the present invention is described with respect to semiconductor wafers and diced chips, such, chips may be diced into arbitrary sizes. Accordingly, the present invention is not limited to the relative size and spacing illustrated in the accompanying figures. In addition, certain features of the drawings are illustrated in exaggerated dimensions for clarity of drawing and ease of explanation.

Embodiments of the invention now will be described, generally with reference to gallium nitride-based light emitting diodes on silicon carbide-based substrates. However, it will be understood by those having skill in the art that many embodiments of the invention may be employed with many different combinations of substrate and epitaxial layers. For example, combinations can include AlGaInP diodes on GaP substrates; InGaAs diodes on GaAs substrates; AlGaAs diodes on GaAs substrates; SiC diodes on SiC or sapphire ($Al_2O_3$) substrates; and/or a nitride-based diodes on gallium nitride, silicon carbide, aluminum nitride, sapphire, zinc oxide and/or other substrates.

Figure 1:
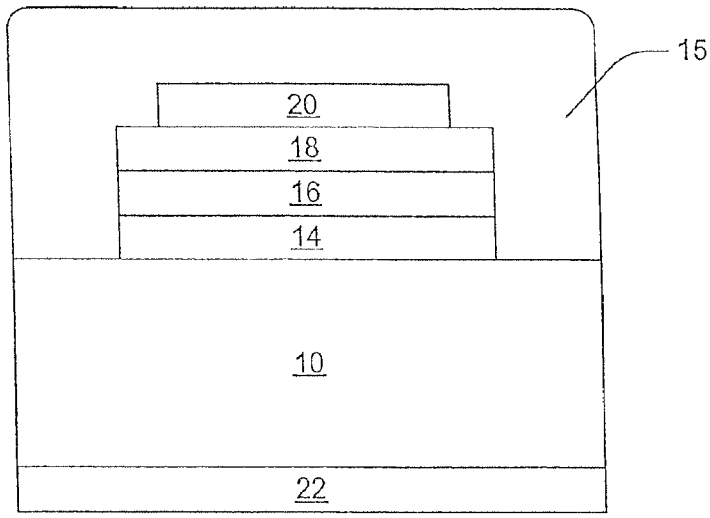
Figure 1 Prior Art
FIG. 1 is a side view of a prior art device prior to wirebonding.

GaN-based light emitting diodes (LEDs) typically comprise an insulating or semiconducting substrate such as SiC or sapphire on which a plurality of GaN-based epitaxial layers are deposited. The epitaxial layers comprise an active region having a p-n junction that emits light when energized. FIG. 1 schematically illustrates a conventional LED having an n-type SiC substrate 10, an active region comprising an n-GaN-based layer 14 and a p-GaN-based layer 16 grown on the substrate and patterned into a mesa. An ohmic contact 18 is formed on the p-GaN layer 16 and bond pad 20 for receiving a wire bond connection is formed on the ohmic contact 18. A cathode ohmic contact 22 is formed on the substrate 10.

A passivation layer 15 covers the upper surface of the device. Passivation layer 15 may comprise a dielectric material such silicon nitride or silicon dioxide. Passivation layer 15 may be deposited using a conventional method such as PECVD deposition or sputtering. Methods of forming passivation layer 15 are described in detail in U.S. Patent Application Publication No. 200310025121 which is hereby incorporated herein in its entirety.

The formation of bond pad 20 requires several photolithography steps. In one such process, after formation of ohmic contact 18, a layer of photoresist (not shown) is applied to the top surface of the device. The photoresist is selectively exposed using a mask and exposed portions of the photoresist are developed out (i.e. removed) to reveal a portion of the upper surface of the ohmic contact layer 18. The bond pad metal (which may be for example Ti/Pt/Au) is then evaporated or sputtered through the developed opening in the photoresist and onto the exposed portion of the ohmic contact. Finally, the remaining photoresist is stripped through immersion in a solvent such as acetone or a stripper such as N-methylpyrolidinone.

Figure 2:
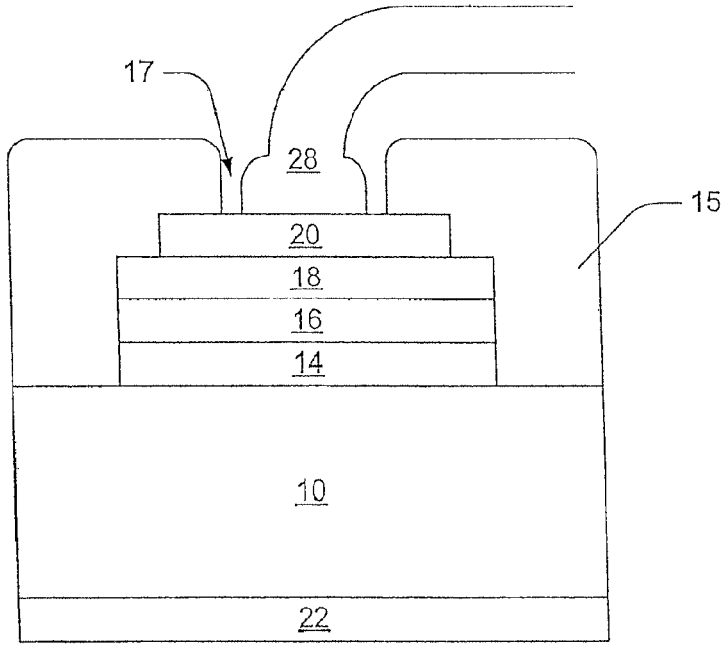
FIG. 2 is a side view of a prior art device after wirebonding.

Turning to FIG. 2, after formation of bond pad 20 and passivation layer 15, a via 17 must be opened in passivation layer 15 in order to permit formation of a wirebond connection to bond pad 20. The steps for opening via 17 in passivation layer 5 are similar to those described above in connection with the formation of bond pad 20. Namely, a photoresist layer is applied, exposed and developed to reveal a portion of the passivation layer 15 above the center region of the bond pad 20. After the photoresist layer is patterned, the passivation layer 15 is etched to reveal the upper surface of the bond pad 20, thereby forming a via in the passivation layer 15. Photolithography steps such as those described above are expensive and time consuming, since they require multiple steps and precise alignment of a mask to a wafer. Since the passivation layer 15 is formed after the bond pad 20 in the device shown in FIGS. 1-2, the ohmic contact 18 is completely covered either by passivation layer 15 or bond pad 20.

Figure 3:
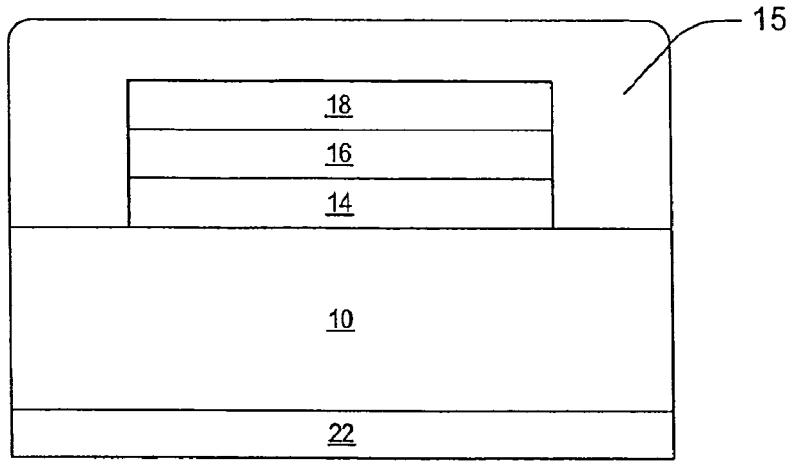
FIG. 3 is a side view of a device according to embodiments of the invention prior to formation of the bond pad.
Figure 4:
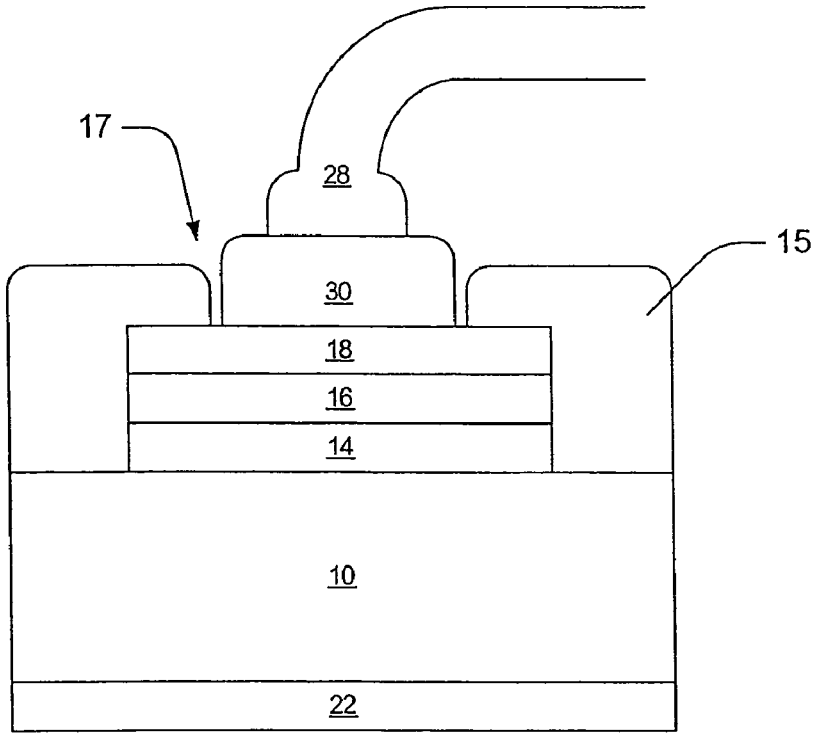
FIG. 4 is a side view of a device according to embodiments of the invention after formation of the bond pad and wirebonding.

Embodiments of the invention which require a reduced number of photolithography steps are illustrated in FIGS. 3 and 4. In these embodiments, a bond pad is formed as a self-aligned feature within a via formed in the passivation layer. Since the bond pad is formed after formation of the via, no additional photolithography steps are required for the bond pad. Moreover, in this embodiment the ohmic contact metal may be selected to provide protection to the top surface of the epitaxial region as well as form an ohmic contact thereto.

Accordingly, FIG. 3 illustrates embodiments of the invention prior to forming a bond pad and prior to wirebonding. FIG. 3 schematically illustrates an LED having an n-type SiC substrate 10, an active region comprising an n-GaN based layer 14 and a p-GaN-based layer 16 grown on the substrate and patterned into a mesa. An ohmic contact 18 is formed on the p-GaN layer 16.

Although substrate 10 is SiC in the illustrated embodiment, substrate 10 may comprise any other suitable substrate material such as sapphire, silicon, gallium arsenide and the like.

A blanket passivation layer 15 covers the exposed upper surfaces of the substrate 10, the epitaxial layers 14 and 16 and the ohmic contact 18.

Passivation layer 15 may comprise a dielectric material such silicon nitride or silicon dioxide and may be applied by known methods such as PECVD or sputter deposition.

Turning to FIG. 4, a via 17 is opened in the passivation layer 15 using photolithography. A metal stack such as Ti/Pt/Au is then deposited within via 17 to form a bond pad to which a wirebond 28 may be made. Since the bond pad 30 is formed within via 17 with a single photolithographic step rather than two steps, the via 17 and the bond pad 30 are said to be self-aligned.

Figure 5A:
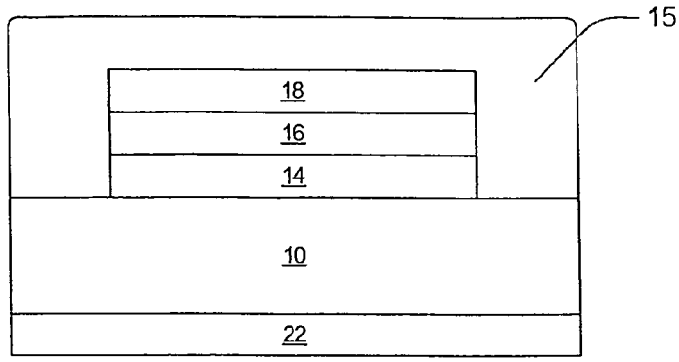
FIGS. 5A-5F are side views of a device according to embodiments of the invention at various process stages.

FIGS. 5A-F illustrate steps for forming the device illustrated in FIGS. 3 and 4. Referring to FIG. 5A, a precursor structure is shown prior to formation of the bond pad. The structure shown in FIG. 5A is identical to the structure shown in FIG. 3. Namely, FIG. 5A illustrates a LED having an n-type SiC substrate 10, an active region comprising an n-GaN-based layer 14 and a p-GaN-based layer 16 grown on the substrate and patterned into a mesa. An ohmic contact 18 is formed on the p-GaN layer 16. A dielectric passivation layer 15 covers the exposed upper surfaces of the substrate 10, the epitaxial layers 14 and 16 and the ohmic contact 18.

Figure 5B:
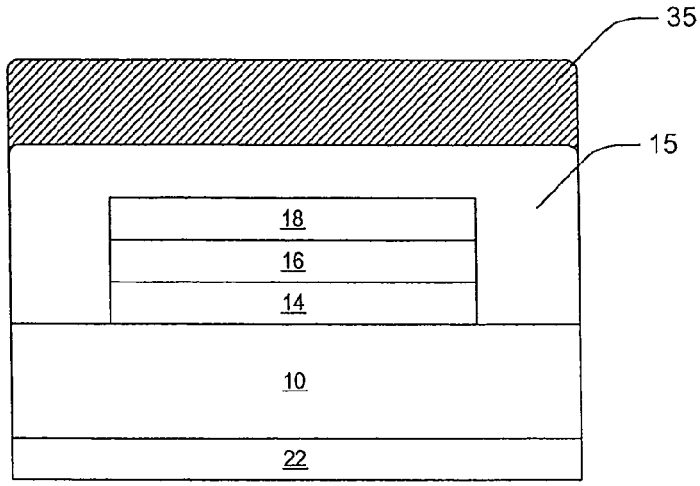
Figure 5C:
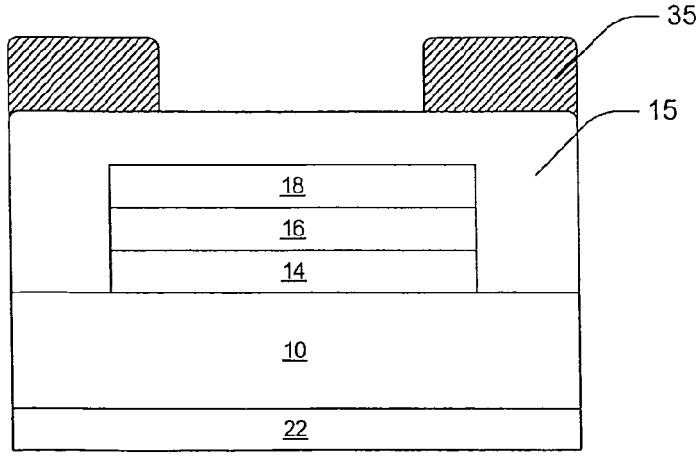
Figure 5D:
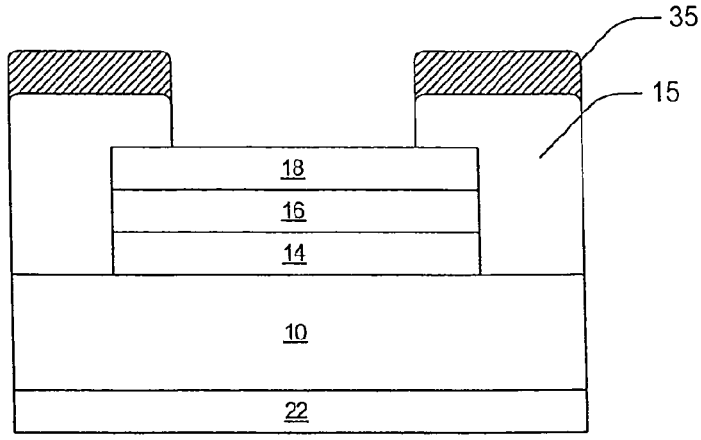

As shown in FIG. 5B, a layer of photoresist 35 is applied across the surface of the structure. The photoresist is then selectively exposed and developed to reveal a portion of the passivation layer 15 above the ohmic contact 18 as illustrated in FIG. 5C. Next, passivation layer 15 is etched using a wet 10 etch chemistry such as a buffered oxide etch (BOE) or a dry etch process such as reactive ion etching (RIE), remote or downstream plasma etching, or a combination of RIE and remote etching, to reveal a portion of the surface of ohmic contact 18 as illustrated in FIG. 5D.

Figure 5E:
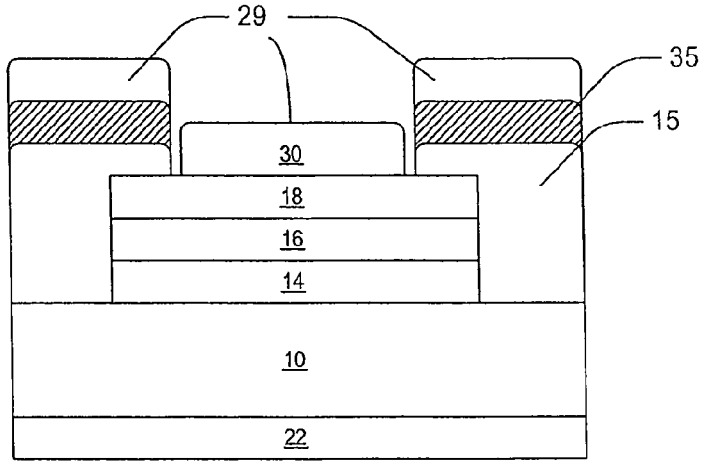
Figure 5F:
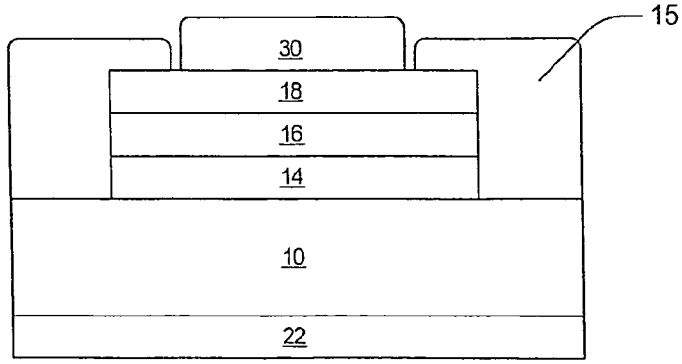

As shown in FIG. 5E, a blanket metal 29 is deposited on the surface of the structure. Metal 29 deposits on the remaining photoresist material 35 as well as the exposed surface of ohmic contact 18, where it forms a bond pad 30. The remaining photoresist is then removed (for example, by immersion in acetone), which removes unwanted portions of metal 29 but leaves bond pad 30 in place. The resulting structure is shown in FIG. 5F.

The method described above may result in a small gap between the bond pad 30 and passivation layer 15 which may cause a small amount of the ohmic contact layer 18 to be exposed. However, the entire device may be encapsulated in a shell of protective material such as silicone which may protect the exposed the exposed portions of ohmic contact 18. Additionally, ohmic contact 18 may comprise a material such as platinum which itself acts to protect the underlying epitaxial layers.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A diode comprising:

a substrate having a first conductivity type;

a first epitaxial layer on a first surface of said substrate having the same conductivity type as said substrate;

a second epitaxial layer on said first epitaxial layer and having the opposite conductivity type from said substrate and said first epitaxial layer;

said first and second epitaxial layers defining a p-n junction therebetween;

a first ohmic contact under a second surface of said substrate opposite to said first surface of said substrate;

a second ohmic contact directly on said second epitaxial layer opposite said first epitaxial layer;

a passivation layer on and directly contacting portions of said first surface of said substrate and portions of said second ohmic contact, said passivation layer defining a via opening over said second ohmic contact; and a wire bond pad on said second ohmic contact, said wire bond pad being self-aligned within the via opening defined by said passivation layer;

wherein said via opening defines a gap between said wire bond pad and said passivation layer, and bottom portions of sidewalls of said via opening are on and directly contact a top surface of said second ohmic contact.

2. A diode according to claim 1 comprising a silicon carbide substrate.

3. A diode according to claim 1 wherein said substrate is selected from the group consisting of [sapphire,] silicon, gallium arsenide, and gallium phosphide.

4. A diode according to claim 1 wherein said first epitaxial layer and said second epitaxial layer are Group III-Group V semiconductors.

5. A diode according to claim 1 wherein said first epitaxial layer and said second epitaxial layer are Group III nitride semiconductors.

6. A diode according to claim 1 wherein said first epitaxial layer and said second epitaxial layer are gallium nitride.

7. A diode according to claim 1 wherein said passivation layer is selected from the group consisting of silicon dioxide and silicon nitride.

8. A diode according to claim 1 wherein said first ohmic contact and said second ohmic contact are selected from the group consisting of titanium, platinum, gold, and combinations thereof.

9. A diode according to claim 1 encapsulated in a protective material.

10. A diode according to claim 9 encapsulated in silicone.

11. A diode comprising:

[a substrate having a first conductivity type;]

a first epitaxial layer [on a first surface of said substrate having the same conductivity type as said substrate];

a second epitaxial layer on said first epitaxial layer [and having the opposite conductivity type from said substrate and said first epitaxial layer];

said first and second epitaxial layers defining [a p-n junction] *an active region that emits light* therebetween;

[a first ohmic contact under a second surface of said substrate opposite to said first surface of said substrate;]

[a second] *an* ohmic contact [directly] on said second epitaxial layer opposite said first epitaxial layer;

a passivation layer, a photoresist layer and a blanket metal layer on [said] portions of [said first] *a* surface of [said] *a* substrate and on portions of said [second] ohmic contact, and said passivation layer and said photoresist layer defining a via opening over said [second] ohmic contact wherein bottom portions of sidewalls of said via opening are on and directly contact a top surface of said [second] ohmic contact; and a wire bond pad on said [second] ohmic contact, said wire bond pad being formed from the same metal as said blanket metal layer and being self-aligned within the via opening defined by said passivation layer and said photoresist layer, wherein there is a gap located between said wire bond pad and said passivation layer.

12. A diode according to claim 11 wherein *said first epitaxial layer is on said surface of said substrate,* said substrate is selected from the group consisting of sapphire, silicon, silicon carbide, gallium arsenide, and gallium phosphide.

13. A diode according to claim 11 wherein said first epitaxial layer and said second epitaxial layer are Group Ill-Group V semiconductors.

14. A diode according to claim 11 wherein said first epitaxial layer and said second epitaxial layer are Group III nitride semiconductors.

15. A diode according to claim 11 wherein said first epitaxial layer and said second epitaxial layer are gallium nitride.

16. A diode according to claim 11 wherein said passivation layer is selected from the group consisting of silicon dioxide and silicon nitride.

17. A diode according to claim 11 wherein said [first ohmic contact and said second] ohmic contact [are] *is* selected from the group consisting of titanium, platinum, gold, and combinations thereof.

* * * * *